United States Patent
Ueda et al.

(10) Patent No.: US 6,822,720 B2
(45) Date of Patent: Nov. 23, 2004

(54) LIQUID CRYSTAL DISPLAY HAVING IMPROVED CONNECTION BETWEEN TFT AND TCP

(75) Inventors: Hiroshi Ueda, Kumamoto (JP); Hitoshi Morishita, Kumamoto (JP)

(73) Assignee: Advanced Display Inc., Kikuchi-gun (JP)

( * ) Notice: Subject to any disclaimer, the term of this patent is extended or adjusted under 35 U.S.C. 154(b) by 220 days.

(21) Appl. No.: 09/778,812

(22) Filed: Feb. 8, 2001

(65) Prior Publication Data

US 2001/0020996 A1 Sep. 13, 2001

(30) Foreign Application Priority Data

Mar. 9, 2000 (JP) .......................... 2000/064865

(51) Int. Cl.⁷ .......................................... G02F 1/1345
(52) U.S. Cl. ............................................... 349/152
(58) Field of Search ................... 349/150, 157, 349/149

(56) References Cited

U.S. PATENT DOCUMENTS

| | | | | |
|---|---|---|---|---|
| 3,883,213 A | * | 5/1975 | Glaister | 439/66 |
| 3,991,463 A | * | 11/1976 | Squitieri et al. | 29/883 |
| 5,555,116 A | * | 9/1996 | Ishikawa et al. | 349/143 |
| 5,572,346 A | * | 11/1996 | Sakamoto et al. | 349/150 |
| 5,850,275 A | * | 12/1998 | Watanabe et al. | 349/110 |
| 5,870,163 A | * | 2/1999 | Watanabe et al. | 349/149 |
| 5,914,763 A | * | 6/1999 | Fujii et al. | 349/143 |
| 6,052,169 A | * | 4/2000 | Kim | 349/139 |
| 6,052,171 A | * | 4/2000 | Kawaguchi | 349/149 |

FOREIGN PATENT DOCUMENTS

| | | | | |
|---|---|---|---|---|
| JP | 4-28289 | 1/1992 | | |
| JP | 4-287022 | 10/1992 | | |
| JP | 04287022 A | * 10/1992 | ......... | G02F/1/1343 |
| JP | 4-289824 | 10/1992 | | |
| JP | 04352132 A | * 12/1992 | ......... | G02F/1/1345 |
| JP | 10206878 A | * 8/1998 | ......... | G02F/1/1345 |
| JP | 10-260421 | 9/1998 | | |
| JP | 2000114677 A | * 4/2000 | ........... | H05K/1/02 |
| JP | 2000252386 A | * 9/2000 | ........... | H01L/23/12 |

\* cited by examiner

*Primary Examiner*—Kenneth Parker
(74) *Attorney, Agent, or Firm*—Oblon, Spivak, McClelland, Maier & Neustadt, P.C.

(57) ABSTRACT

The present invention is directed to a liquid crystal display including: a plurality of electrode terminals arranged on one of end faces of a TFT glass substrate in such a manner as to be aligned on an imaginary line; and a plurality of lead terminals of a tape carrier package aligned on the electrode terminals, said plurality of lead terminals connected through an anisotropic conductive film; wherein the electrode terminals near the end face of the glass substrate is formed obliquely in such a manner as to be extended in the direction of both right and left with respect to the plurality of electrode terminals.

5 Claims, 3 Drawing Sheets

LIQUID CRYSTAL DISPLAY HAVING IMPROVED CONNECTION BETWEEN TFT AND TCP

BACKGROUND OF THE INVENTION

The present invention relates to a device subject to pushing a thermocompression bonding tool against a lead of an electronic part to be connected to a printed circuit board.

Examples of a technique for mounting a driving circuit through thermocompression bonding include a technique for mounting an IC module of a liquid crystal display. The liquid crystal display is generally obtained by connecting a driving circuit to a TFT liquid crystal module interposing liquid crystal material between two glass substrates and superposing them on an illuminating device. In general, the driving circuit of the TFT (thin film transistor) liquid crystal module is constituted by a tape-shaped film carrier package (TCP) provided with an LSI for driving TFTs and a printed circuit board (PCB) for sending power and image signals to the TFT module. FIG. 3 is a diagram showing the structure of a driving circuit section of a conventional TFT liquid crystal module. The reference numeral 1 denotes a TFT substrate on which a plurality of source electrodes and gate electrodes are formed, the reference numeral 2 denotes a color filter, the reference numerals 3 and 4 denote ACF (anisotropic conductive films) in which conductive particles are distributed into adhesive material, the reference numeral 5 denotes a driving LSI, the reference numeral 6 denotes TCPs provided with the driving LSI and having input terminals and output terminals, and the reference numeral 7 denotes the printed circuit boards. The ACF 3 is bonded to a terminal section of the TFT substrate 1 where the TCPs 6 are aligned and temporarily compression bonded one by one. Then, a plurality of TCPs 6 arranged in a line along one end face of the TFT substrate 1 are permanently compression-bonded and heated collectively by using one heater tool and are thereby connected to the TFT substrate 1. By the process in which TCPs 6 arranged in a line along the end face of the TFT substrate 1 are permanently compression bonded collectively, the number of manufacturing steps can be reduced.

When a TFT terminal electrode is connected to the TCP by using the above-mentioned method, a temperature gradient is generated between a panel end of a TCP lead and a central part thereof. Therefore, the lead is deformed to have an L shape at the panel end and is thus connected. For this reason, although a terminal of a glass substrate is parallel with the TCP lead before the connection, a mutual non-parallel portion is generated due to the deformation after the thermocompression bonding so that an electrode of the substrates and the TCP lead which should be originally adjacent but be apart come in contact with each other and are electrically short-circuited. In some cases, consequently, a liquid crystal module is not operated normally. The following countermeasures have been taken for such a shift of the TCP lead.

In the invention described in Japanese Unexamined Patent Publication No. 265023/1993, width and pitch of the TCP leads are changed so as to gradually increase toward both ends of a terminal arrangement. Thus, the influence of a terminal shift caused by the thermal expansion of a TCP is reduced.

In the invention described in Japanese Unexamined Patent Publication No. 206878/1998, an electrode of a glass substrate is formed to have a width reduced gradually toward an end of a lead line. Thus, also in the case in which a TCP is mounted with an oblique shift, an electrode comes in contact with an adjacent lead is avoided.

In the invention described in Japanese Unexamined Patent Publication No. 260421/1998, electrodes of a glass substrate are arranged like a fan. Thus, a terminal shift between the electrode of the glass substrate and a TCP lead can be reduced.

In the invention described in the Japanese Unexamined Patent Publication No. 265023/1993, however, a countermeasure is taken for only the shift in a parallel direction of the terminal of the glass substrate and the TCP lead, and is not effective for a terminal shift in an oblique direction. In the invention described in the Japanese Unexamined Patent Publication No. 206878/1998, if the mounting is carried out obliquely, there is a problem in that an overlap area of the electrode with the lead is reduced and the connecting reliability of the terminal is deteriorated. In the invention described in the Japanese Unexamined Patent Publication No. 260421/1998, the electrodes of the glass substrate are arranged like a rectilinear fan. This shape is not identical to that of the TCP lead which is obtained after the thermocompression bonding. Actually, the TCP lead has a shape shown in FIG. 1(b) after the thermocompression bonding. Since the TCP leads have a uniform high temperature during the compression bonding from a tip portion thereof to a central part thereof (see 8a of FIG. 1B), they are arranged in almost parallel with each other. Since the temperature during the compression bonding is gradually dropped from the vicinity apart from a glass substrate end by 0.3 mm toward the glass substrate end (see 8b of FIG. 1B), the whole TCP leads are bent to have an "L" shape toward the inside in this portion. In particular, the above-mentioned shape is more remarkable in a closer portion to both ends of the terminal arrangement. In the invention described in the Japanese Unexamined Patent Publication No. 260421/1998, the electrodes are formed like a rectilinear fan. However, the shape of the TCP lead is different from that of the glass substrate electrode after the compression bonding. Therefore, this invention is insufficient for the countermeasure to be taken for the terminal shift.

It is an object of the present invention to provide liquid crystal display and method of manufacturing the same in which a positional shift of a glass substrate electrode and a TCP lead can be prevented from being generated due to deformation during compression bonding.

SUMMARY OF THE INVENTION

A first aspect of the present invention is directed to a liquid crystal display having a plurality of electrode terminals arranged on one of ends of a TFT glass substrate and having a lead terminal of a tape carrier package aligned on the electrode terminals and connected through an anisotropic conductive film, wherein the electrode terminal, of the glass substrate is formed to be bent obliquely in at least one place in the vicinity of an end face.

A second aspect of the present invention is directed to a liquid crystal display having a plurality of electrode terminals arranged on one of ends of a TFT glass substrate and having a lead terminal of a tape carrier package aligned on the electrode terminals and connected through an anisotropic conductive film, wherein the lead terminal of the tape carrier package is formed to be bent obliquely in at least one place in the vicinity of an end face of a glass substrate electrode.

DETAILED DESCRIPTION

Figure 1A:
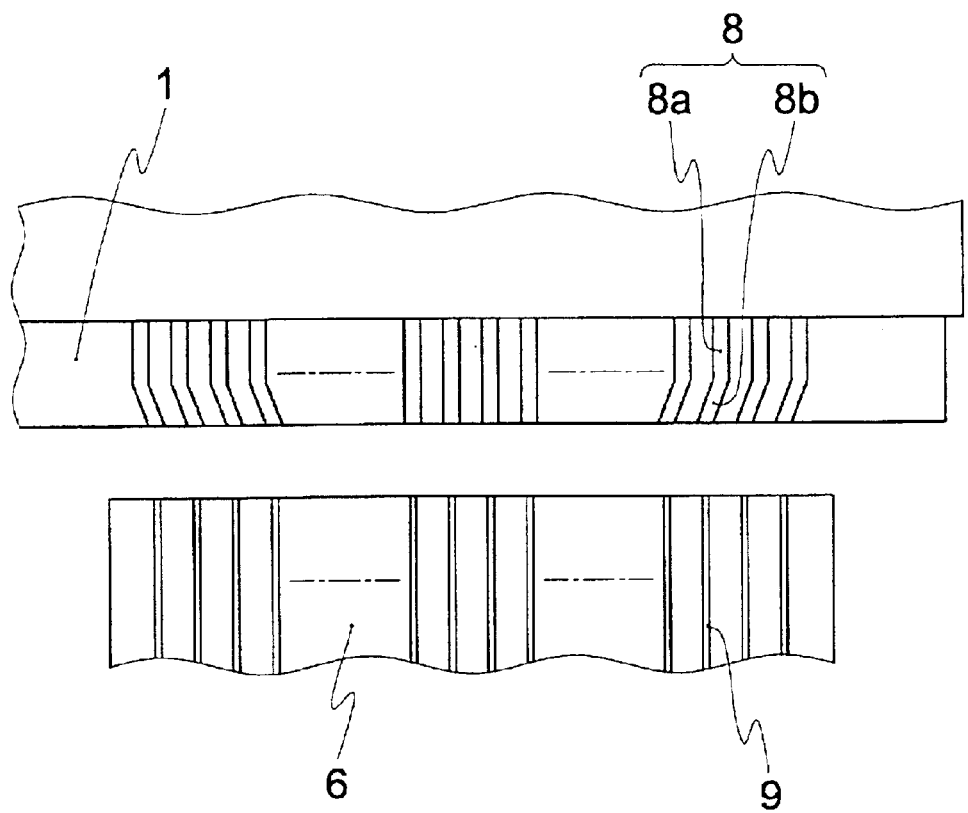
FIGS. 1(a) and 1(b) are diagrams showing the structure of a part in which a printed circuit board is to be connected according to an embodiment of the present invention.
Figure 1B:
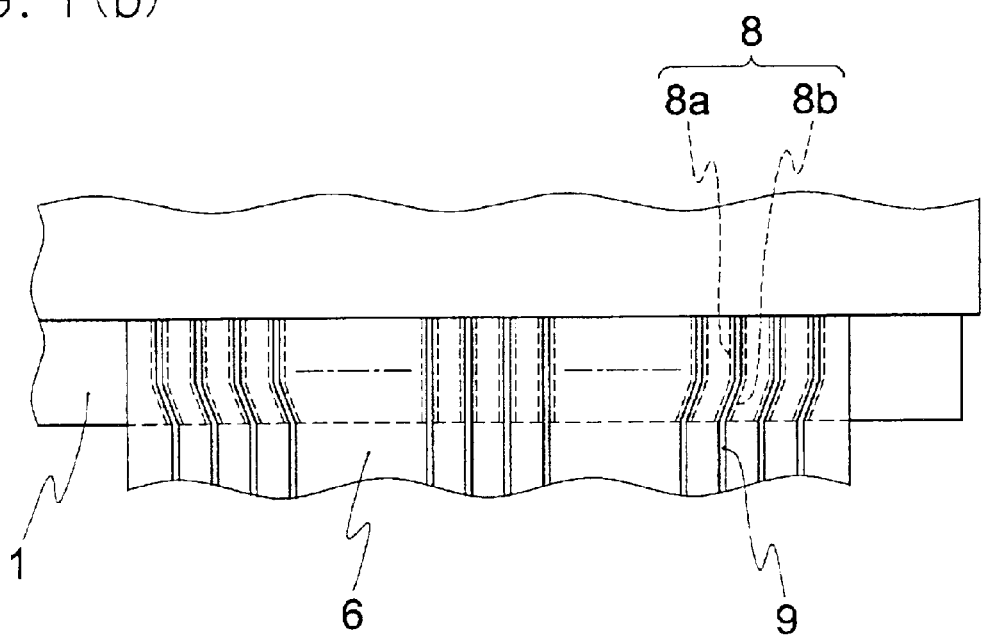
Figure 2A:
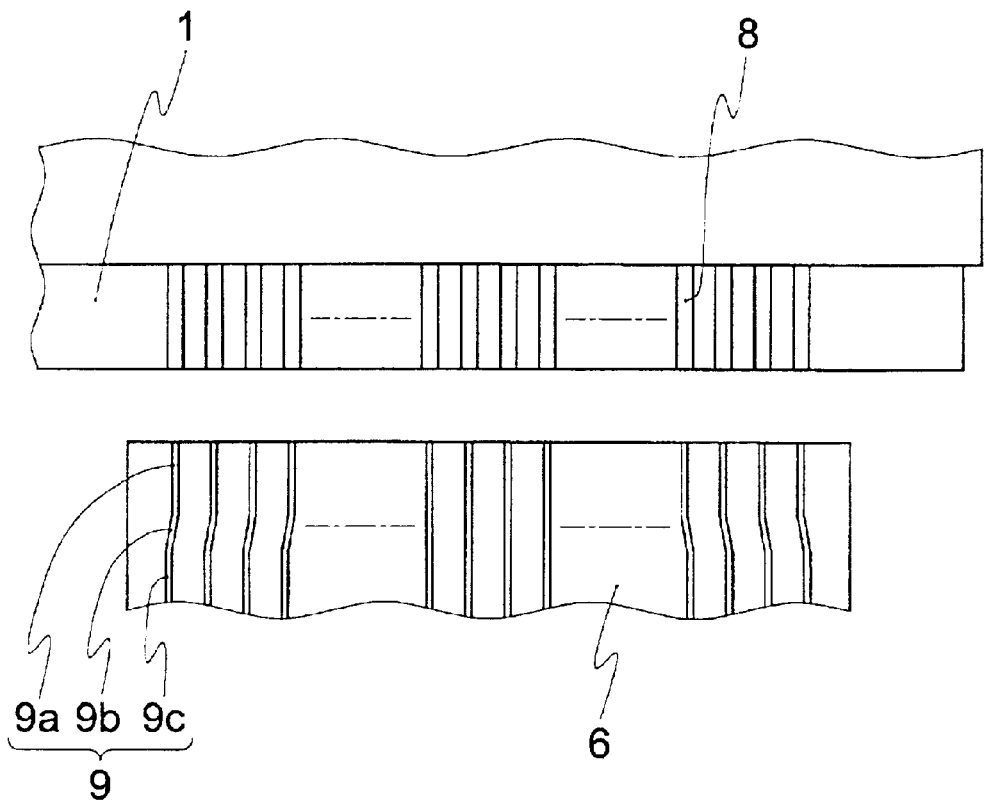
FIGS. 2(a) and 2(b) are diagrams showing the structure of a part in which an electrode terminal of a TFT is provided straight and a part of a TCP lead is formed obliquely according to another embodiment of the present invention.
Figure 2B:
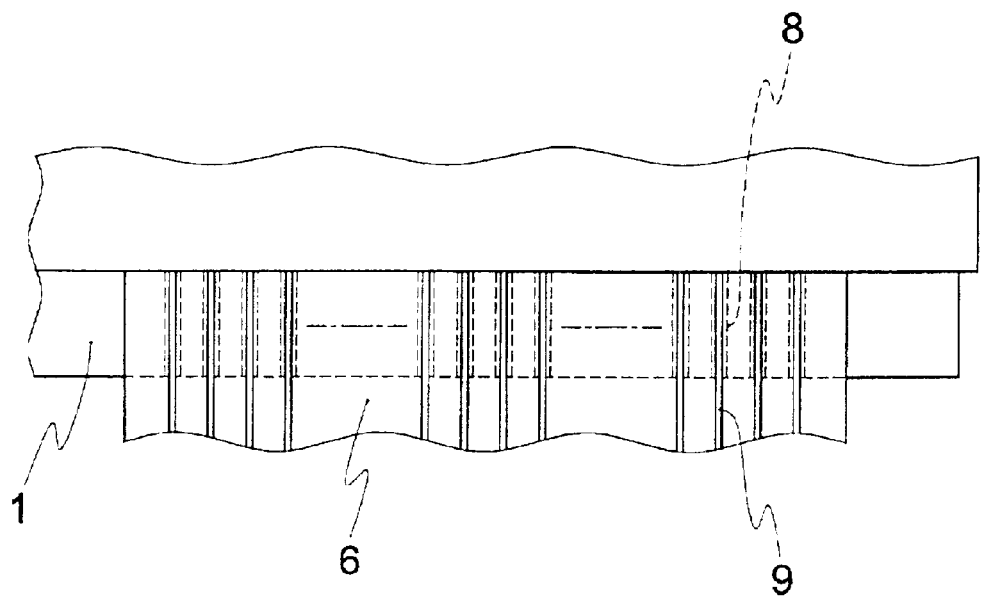
Figure 3:
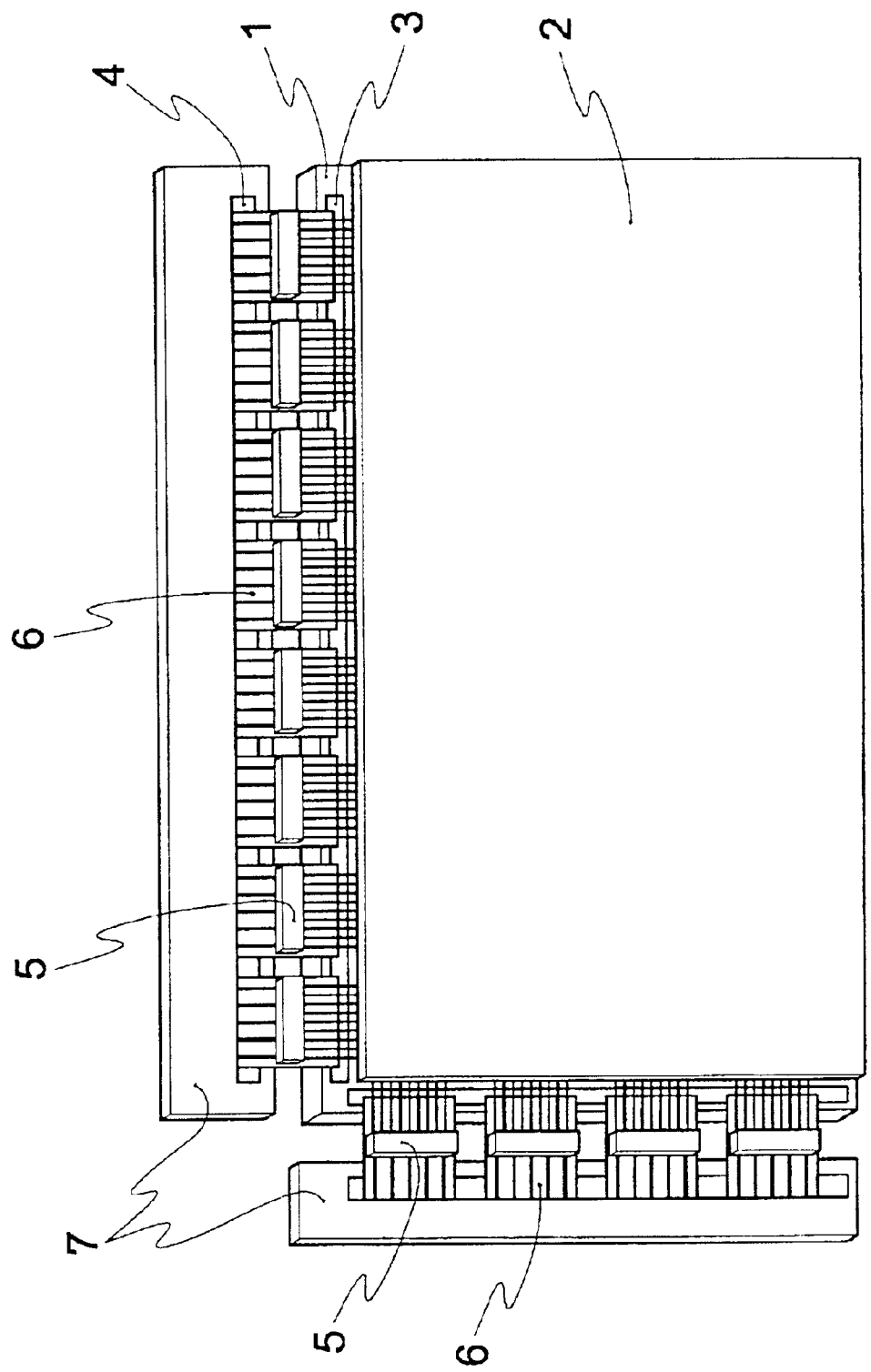
FIG. 3 is a diagram showing the structure of a driving circuit section of a conventional TFT liquid crystal module.

An embodiment of a method of connecting a printed circuit board and a device formed thereby according to the present invention will be described below with reference to the accompanying drawings. FIGS. 1(a), 1(b), 2(a) and 2(b) are plan views illustrating an example of a liquid crystal module according to the embodiment of the present invention. As shown in FIG. 3, the liquid crystal module is constituted by a TFT substrate 1 provided with a plurality of source electrodes and gate electrodes, and a TCP 6 having a driving LSI 5 mounted thereon. An electrode arranged on the TFT substrate 1 and a lead of the TCP 6 are connected to each other through an anisotropic conductive film 3. Thus, conduction is obtained. FIGS. 1(a), 1(b), 2(a) and 2(b) show two embodiments of the present invention. FIG. 1(a) and FIG. 2(a) illustrate a TFT electrode terminals 8 which are aligned in a comb teeth manner along an end face of the TFT substrate 1 and TCP lead 9 which have not been connected, and FIG. 1(b) and FIG. 2(b) illustrate the TFT electrode terminal 8 and the TCP lead 9 which have been connected. In an example of FIGS. 1(a) and 1(b), a part of the electrode terminal 8 is obliquely formed on the TFT substrate 1 and the TCP lead 9 is formed straight. As shown in FIG. 1(a), the electrode terminal 8 formed on the TFT substrate 1 is divided into a straight region 8a and an oblique region 8b. For example, if the TFT electrode terminal 8 has a length of 1.1 mm, the 8a portion is formed to have a length of approximately 0.6 to 0.7 mm and the 8b portion is formed to have a length of approximately 0.4 to 0.5 mm. The 8b portion is appropriately inclined with respect to the 8a portion at an angle of 1.1 to 1.4 degrees on both ends of the TCP 6 having a width of 25 mm. A gradient of the 8b portion is 0 degree in a central part of the TCP 6 and is set to be increased in proportion to a distance from a center of the TCP 6. When the electrode terminal 8 of the TFT substrate and the TCP lead 9 which are formed with such a structure are connected through the anisotropic conductive film 3 by thermocompression bonding, the TCP lead 9 is bent in the middle through thermal expansion in the same manner as the electrode terminal 8 of the TFT substrate as shown in FIG. 1B and is superposed on the TFT substrate electrode 8 with high precision. In an example of FIG. 2, a part of the TCP lead 9 is formed obliquely and the electrode terminal 8 is formed straight on the TFT substrate. The TCP lead 9 is divided into a straight region 9a and an oblique region 9b. A ratio of lengths of the regions 9a and 9b and angles are the same as those in the example of FIGS. 1(a) and 1(b). When the electrode terminal 8 of the TFT substrate and the TCP lead 9 which are formed with such a structure are connected through the thermocompression bonding through the anisotropic conductive film 3, the TCP lead 9 is formed straight through the thermal expansion in the same manner as the electrode terminal 8 of the TFT substrate and is superposed on the electrode terminal 8 with high precision as shown in FIG. 2(b).

The present invention is effective for connecting an electrode formed on a flexible film having a large coefficient of thermal expansion to another electrode through thermocompression bonding as in the connection of a printed circuit board of a liquid crystal display, for example.

As described above, according to the present invention, the oblique region is previously formed on the TFT substrate electrode 8 or a part of the TCP lead 9. Consequently, the TFT substrate electrode 8 and the TCP lead 9 can have the same shapes through the thermal expansion of the TCP 6 during the thermocompression bonding so that a mutual positional shift can be almost eliminated. As a result, the generation of a short-circuit can be prevented between adjacent electrodes and a contact area of a terminal to be connected can be maintained. Therefore, it is also possible to prevent defective open of the connection so that the quality of a module can be enhanced. These effects are more remarkable in case with a smaller pitch of the electrode to be connected.

What is claimed is:

1. A liquid crystal display comprising:
   a plurality of electrode terminals arranged in a comb teeth manner along one end face of a TFT glass substrate; and
   a plurality of lead terminals of a tape carrier package aligned overlapped on the electrode terminals, said plurality of lead terminals connected through an anisotropic conductive film;
   wherein at least one of the electrode terminals along the end face of the glass substrate is formed in such a manner as to have a parallel straight region and an oblique region converging toward the end face of the TFT substrate, and
   wherein at least one of said lead terminals bends from a preformed shape to substantially align with said at least one electrode terminal after such terminals are connected through the conductive film.

2. A liquid crystal display comprising:
   a plurality of electrode terminals arranged in a comb teeth manner along one end face of a TFT glass substrate in such a manner as to be aligned on an imaginary line; and
   a plurality of lead terminals of a tape carrier package aligned in a comb teeth manner along the electrode terminals, said plurality of lead terminals connected through an anisotropic conductive film;
   wherein at least one of the lead terminals of the tape carrier package is formed in such a manner as to have a parallel straight region and an oblique region converging toward an end face of the tape carrier package, and wherein the oblique region of said at least one lead terminal straightens to substantially align with a respective electrode terminal after such terminals are connected through the conductive film.

3. A method of joining the leads of a tape carrier package (TCP) to the electrodes of a thin film transistor (TFT) substrate in a liquid crystal display, the method comprising:

pre-forming at least one of said leads or at least one of said electrodes to have a pre-connection shape including a straight region and an oblique region;

overlapping said electrodes with said leads; and electrically connecting said electrodes and leads through an anisotropic conducting film by thermocompression bonding, which causes said preformed lead or electrode to be substantially aligned with the respective lead or electrode to which it is connected.

4. A TFT substrate comprising:

a plurality of electrode terminals arranged in a comb teeth manner along one end face of the TFT substrate and connected to a plurality of lead terminals of a film carrier through an anisotropic conductive film;

wherein at least one of the electrode terminals of said TFT substrate is formed in such a manner as to have a pre-connection shape including a parallel straight region and a bent region in an overlapping area of said TFT substrate with said film carrier such that a respective lead terminal of the film carrier will be substantially aligned to the predetermined shape of the at least one electrode when connected thereto.

5. A film carrier comprising a plurality of lead terminals being connected to a plurality of electrode terminals arranged in a comb teeth manner along one end face of a TFT substrate through an anisotropic conductive film;

wherein at least one of said lead terminals of the film carrier is formed in such a manner as to have a pre-connection shape including a parallel straight region and a bent region in an overlapping area of said TFT substrate with said film carrier such that said at least one lead terminal will be substantially aligned to a respective electrode when connected thereto.

* * * * *